United States Patent [19]
Hikosaka et al.

[11] Patent Number: 5,023,674
[45] Date of Patent: Jun. 11, 1991

[54] FIELD EFFECT TRANSISTOR

[75] Inventors: Kohki Hikosaka, Atsugi; Yasutake Hirachi, Musashino, both of Japan

[73] Assignee: Fujitsu Limited, Kawasaki, Japan

[21] Appl. No.: 593,502

[22] Filed: Oct. 4, 1990

Related U.S. Application Data

[63] Continuation of Ser. No. 219,795, Jul. 14, 1988, abandoned, which is a continuation of Ser. No. 897,919, Aug. 19, 1986, abandoned.

[30] Foreign Application Priority Data

Aug. 20, 1985 [JP] Japan .................................. 60-182198
Sep. 28, 1985 [JP] Japan .................................. 60-215603

[51] Int. Cl.⁵ .................. H01L 29/267; H01L 29/080
[52] U.S. Cl. ......................................... 357/16; 357/4; 357/22
[58] Field of Search ............. 357/22 A, 22 MD, 16, 357/4, 4 SL

[56] References Cited

U.S. PATENT DOCUMENTS

| | | | |
|---|---|---|---|
| 4,575,924 | 3/1986 | Reed et al. | 357/22 A |
| 4,605,945 | 8/1986 | Katayama et al. | 357/22 A |
| 4,792,832 | 12/1988 | Baba et al. | 357/16 |

FOREIGN PATENT DOCUMENTS

| | | | |
|---|---|---|---|
| 0133342 | 2/1985 | European Pat. Off. | 357/22 MD |
| 0100577 | 6/1984 | Japan | 357/22 MD |
| 0111371 | 6/1984 | Japan | 357/22 MD |
| 0028273 | 2/1985 | Japan | 357/22 MD |
| 0089979 | 5/1985 | Japan | 357/22 MD |
| 0193382 | 10/1985 | Japan | 357/22 MD |

OTHER PUBLICATIONS

Microelectronic Engineering, vol. 2, Nos. 1/3, Oct. 1984, "Physics of Nanometer Structure Devices", by C. Hamaguchi et al., pp. 34–43; and Single Quantum Well Transistor with AlGaAs/GaAs/AlGaAs Heterostructures, pp. 40–42.

Applied Physics Letters, vol. 45, No. 8, Oct. 1984, "High Performance Inverted and Large Current Double Interface Modulation-Doped Field-Effect Transistors with the Bulk (Al,Ga)As Replaced by Superlattice at the Inverted Interface", by D. Arnold et al., pp. 902–904.

IEEE Transactions on Electron Devices, vol. ED-28, No. 5, May 1981, "Characteristics of Planar Doped FET Structures", K. Board et al., pp. 505-510.

S. Judaprawira et al., "Mod-doped MBE GaAs/n-Al$_x$Ga$_{1-x}$As MESFETs," IEEE Electr. Dev. Lett., vol. EDL-2, #1, Jan. 1981, pp. 14, 15.

Primary Examiner—Rolf Hille
Assistant Examiner—Peter Toby Brown
Attorney, Agent, or Firm—Staas & Halsey

[57] ABSTRACT

A field effect transistor includes a semiconductor substrate, first and second semiconductor layers formed on the semiconductor substrate, and third semiconductor layers located between the first and second semiconductor layers. The third semiconductor layers have a forbidden band width narrower than those in the first and second semiconductor layers and form a quantum well. The third semiconductor layers include a doping layer such as planar-doping or high doping, and a channel is formed in the third semiconductor layers along the quantum well. The electrons supplied from the doped layer are confined by the quantum well and form a quasi-two-dimensional electron gas.

5 Claims, 10 Drawing Sheets

ENERGY BAND OF FIG4 DEVICE

DISTRIBUTION OF ELECTRONS
IN QUANTUM WELL

ENERGY BAND OF FIG 7 DEVICE

DISTRIBUTION OF ELECTRONS
IN QUANTUM WELL

DISTRIBUTION OF ELECTRONS
IN QUANTUM WELL

ENERGY BAND IN ANOTHER EMBODIMENT

DISTRIBUTION OF ELECTRONS
IN QUANTUM WELL

ENERGY BAND IN STILL ANOTHER EMBODIMENT

DISTRIBUTION OF ELECTRONS IN QUANTUM WELL

FIELD EFFECT TRANSISTOR

This is a continuation of application Ser. No. 07/219,795 filed on July 15, 1988, now abandoned, which is a continuation of Ser. No. 06/897,919 filed on Aug. 19, 1986, now abandoned.

BACKGROUND OF THE INVENTION

1. Field of the Invention

The present invention relates to a field effect transistor, and particularly to a device having a quantum well in a channel structure. The channel formed along the quantum well is two-dimensional due to confinement of carriers in the quantum well.

2. Description of the Related Art

Many attempts have been made to improve the characteristics of a field effect transistor FET in realizing a high transconductance (gm), in reducing a short channel effect and so on. The basic GaAs MESFET has a semi-insulator GaAs substrate, an n-GaAs layer, n+ layers contacting with a source and a drain respectively, source and drain electrodes, and a gate electrode. When a bias voltage is applied to the gate electrode, a depletion layer is extended to control a current flow. At this time, if a channel length is shortened, there will be caused a problem on the short channel effect. Generally when the channel length is about 1 μm or less, a threshold voltage $V_{th}$ of the field effect transistor is positively changed. In this case the larger the impurity concentration N in an active layer of the channel, the smaller the change of the threshold $V_{th}$. Therefore, in order to reduce the short channel effect in a MESFET, the active layer may be highly doped. Once the active layer is highly doped, the depletion layer is made thinner so that the gm may be improved.

In the prior art device, however, the number of carriers cannot be simply increased by employing high doping due to such problems as a decrease in electron mobility and a decrease in a device withstand voltage.

SUMMARY OF THE INVENTION

It is an object of the present invention to provide an improved field effect transistor in which the number of carriers can be increased while maintaining or enhancing both the electron mobility and the device breakdown voltage.

According to the present invention, there is provided a field effect transistor including: a semiconductor substrate; first and second semiconductor layers formed on the semiconductor substrate; and third semiconductor layers located between the first and second semiconductor layers, having a forbidden band width narrower than those in the first and second semiconductor layers, and forming quantum wells. The third semiconductor layers include a doping layer; and a channel is formed in the third semiconductor layers along the quantum wells.

In the field effect transistor according to the present invention, the quantum well is formed between i-AlGaAs layers. A planar doping or high doping is employed in the GaAs layer of the quantum well. The electrons supplied from the layer are confined by the quantum well, and the width of the well is virtually within 100 angstroms to provide the two-dimensionality in electrons.

DESCRIPTION OF THE PREFERRED EMBODIMENTS

Figure 1:
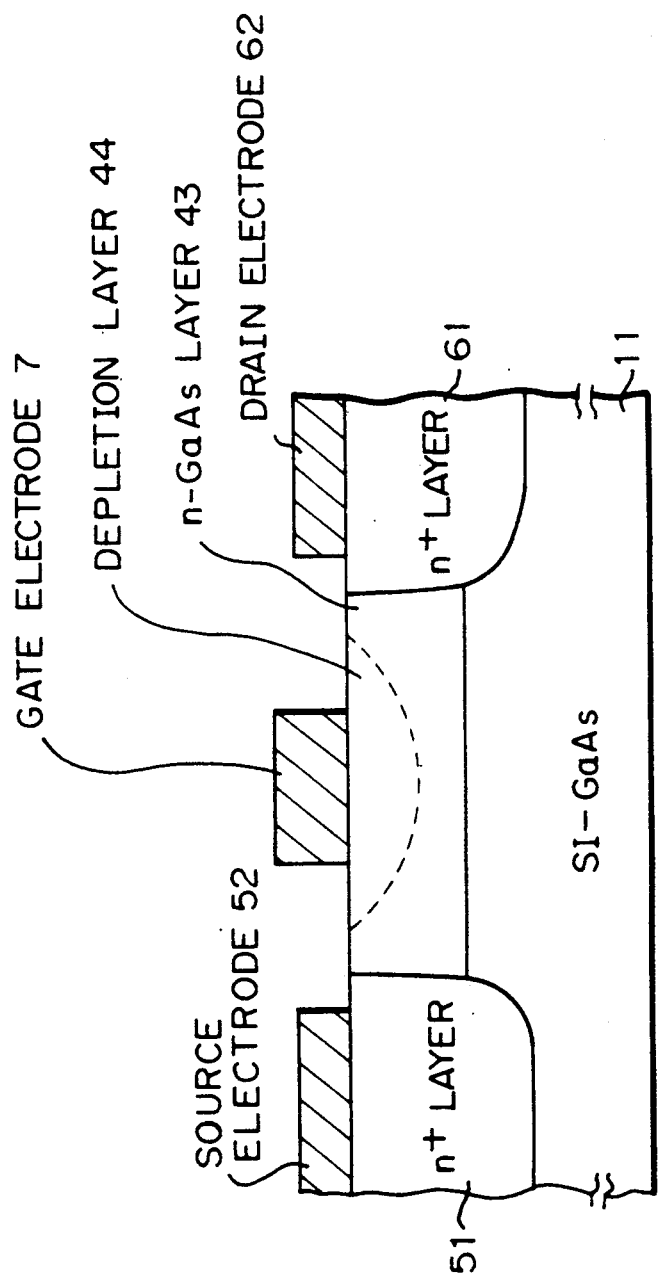
FIG. 1 is a view showing the constitution of a prior art GaAs MESFET.
Figure 2:
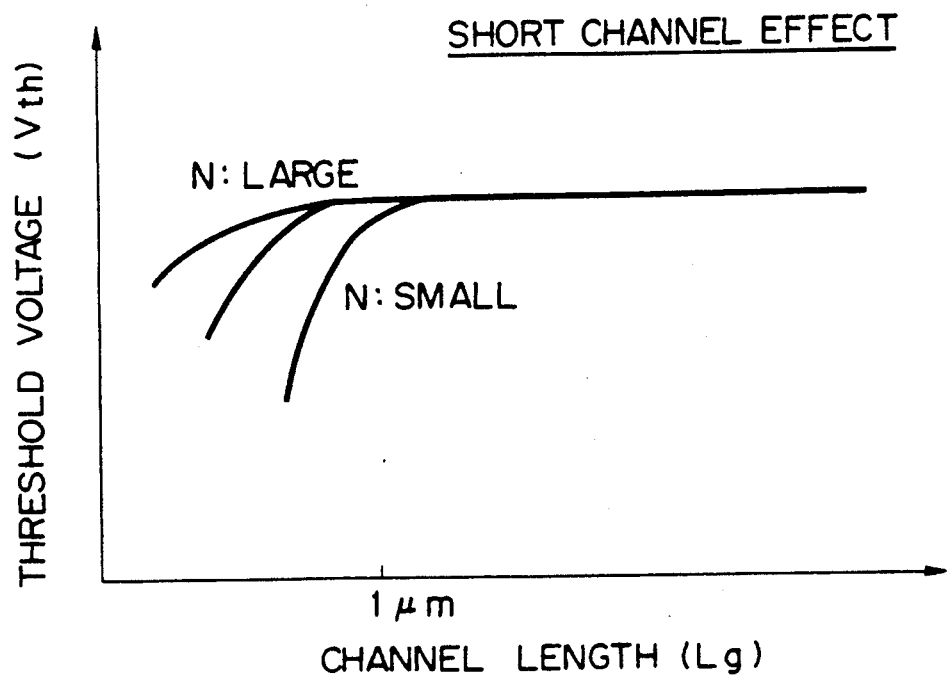
FIG. 2 is a characteristic diagram explaining a short channel effect.
Figure 3:
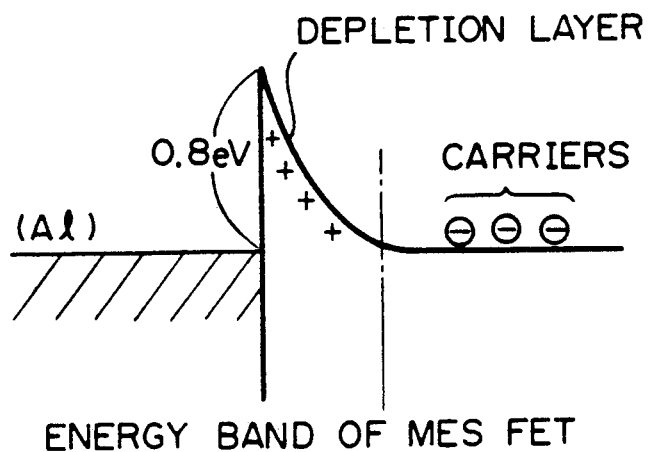
FIG. 3 is a characteristic diagram explaining an energy band of the MESFET.

Before describing the preferred embodiments of the present invention, an explanation will be given for the prior art GaAs MESFET with reference to FIG. 1. In FIG. 1, 11 represents a semi-insulating (SI) GaAs substrate; 43 an n-GaAs layer; 51 and 61 n+layers in contact with a source and a drain respectively; 52 and 62 a source electrode and a drain electrode respectively; and 7 a gate electrode. When a bias voltage is applied to the gate electrode 7, a depletion layer 44 is extended to control a channel current. At this time, if the channel length is shortened, the problem on a short channel effect may occur, as shown in FIG. 2; when the channel length is reduced to about one μm or less, a threshold voltage $V_{th}$ of the field effect transistor is changed as shown in FIG. 2. In this case the larger the impurity concentration N in an active layer of the channel, the smaller the change of the threshold $V_{th}$. Therefore, the active layer will be highly doped in order to reduce the short channel effect. Once the active layer is highly doped, a depletion layer shown in an energy band of FIG. 3 is thinner and the number of carriers to be modulated increases, so that the gm may be improved.

In the prior art device, however, the number of carriers cannot be simply increased because of the problems such as a decrease in electron mobility (which effect leads to a decrease in electron velocity) and a decrease in a device breakdown voltage.

Figure 4:
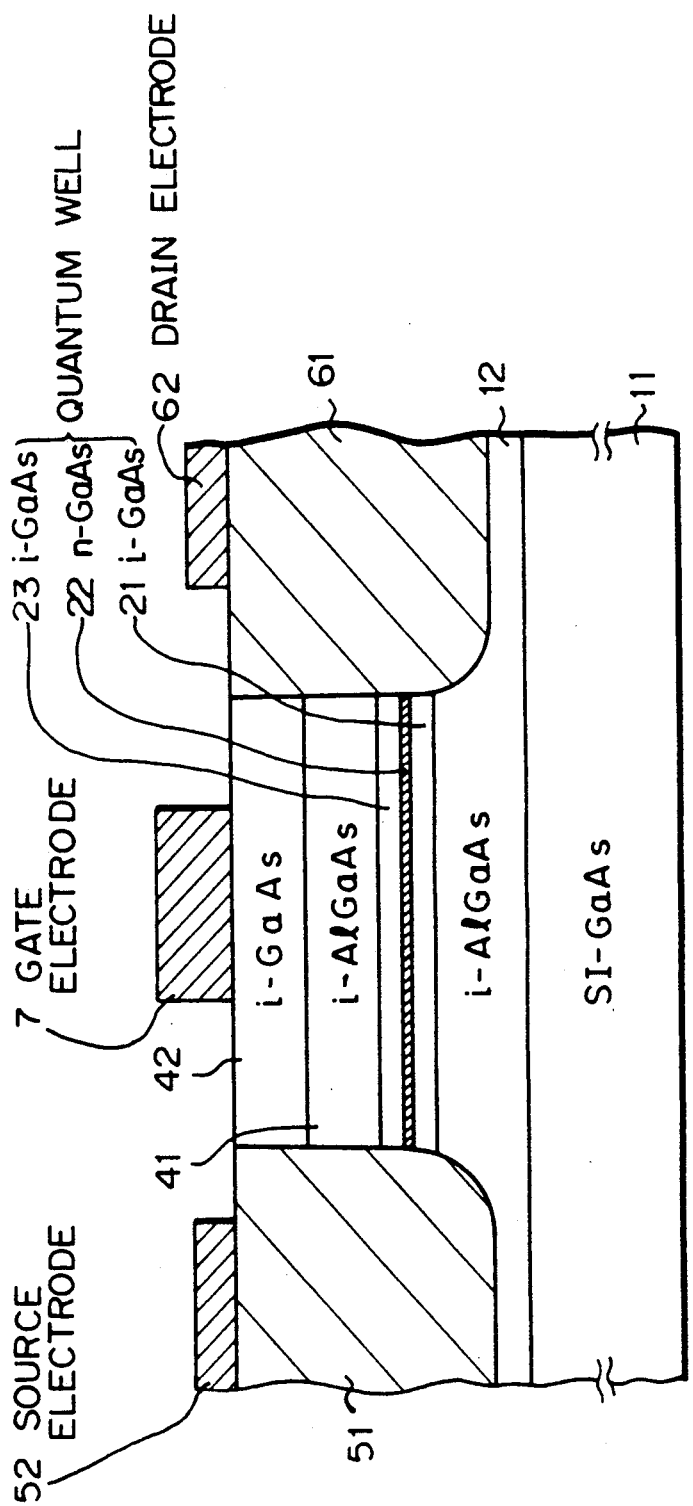
FIG. 4 is a view showing the constitution of a field effect transistor according to an embodiment of the present invention.

FIG. 4 shows a constitution of a field effect transistor according to an embodiment of the present invention. In FIG. 4, on a semi-insulating (SI) GaAs substrate 11, an i-AlGaAs layer 12, a quantum well region QW, an i-AlGaAs layer 41, and an i-GaAs layer 42 are formed. A mole fraction x of the AlAs in the i-AlGaAs layers 12 and 41 is generally from 0.2 to 1.0, but is selected to be, for example, 0.2 to 0.3, partly because of their quality in material.

The quantum well region QW is composed of an i-GaAs layer 21, an n-GaAs layer 22, and an i-GaAs layer 23, and is also included in AlGaAs layers. The doping layer 22 in the quantum well QW is, for example, a planar doping or high doping layer.

The above layers may be embodied as follows:

Layers 12 and 41: These are undoped-AlGaAs layers each having a layer thickness of several hundred angstrom so that carriers cannot tunnel therethrough.

Layers 21 and 23: These are undoped-GaAs layers, each having a layer thickness of several tens of angstroms.

Layer 22: This is an n-GaAs layer. If a planar doping is adopted for the layer, it will be an atomic planar doping wherein an Si or Se atomic-mono-layer is interposed between the i-GaAs layers, and if a high doping is adopted, the doping concentration will range from $10^{18}$ to $10^{19}$ cm$^{-3}$. The layer thickness is virtually several tens of angstroms to about one hundred angstroms. The doped n-GaAs layer 22 is provided in the non-doped i-GaAs layers 21 and 23 on both sides thereof to prevent the dopants from diffusing toward the i-AlGaAs layers 12 and 41. The quantum well QW region composed of the layers 21, 22, and 23 (and also 12 and 41) is 100 angstroms or less in thickness to ensure the two-dimensionality of electrons.

Layer 42: This is an undoped-GaAs layer having a layer thickness of several hundred angstroms.

The doping layer 22 may be formed at a position close to a heterojunction in the quantum well. Preferably, the doping layer is provided close to the heterojunctions (ten angstroms or so) since the electron mobility is enhanced due to effective separation between ionized impurity and two-dimensional electrons.

In FIG. 4, the numerals 51 and 61 represent n$^+$ regions of $10^{17}$ to cm$^{-3}$ formed by an ion implantation with Si$^+$ ions; 52 and 62 a source electrode and a drain electrode respectively (AuGe/Au); and 7 a gate electrode (Al).

Figure 5A:
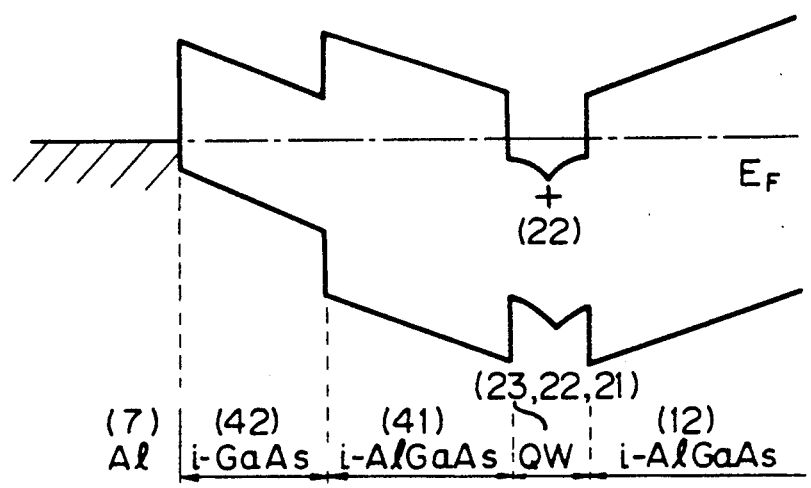
FIGS. 5A and 5B are characteristic diagrams explaining energy band and electron distribution in the device shown in FIG. 4.
Figure 5B:
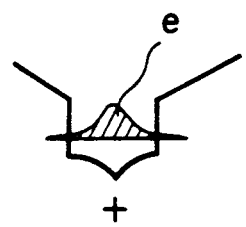
Figure 6:
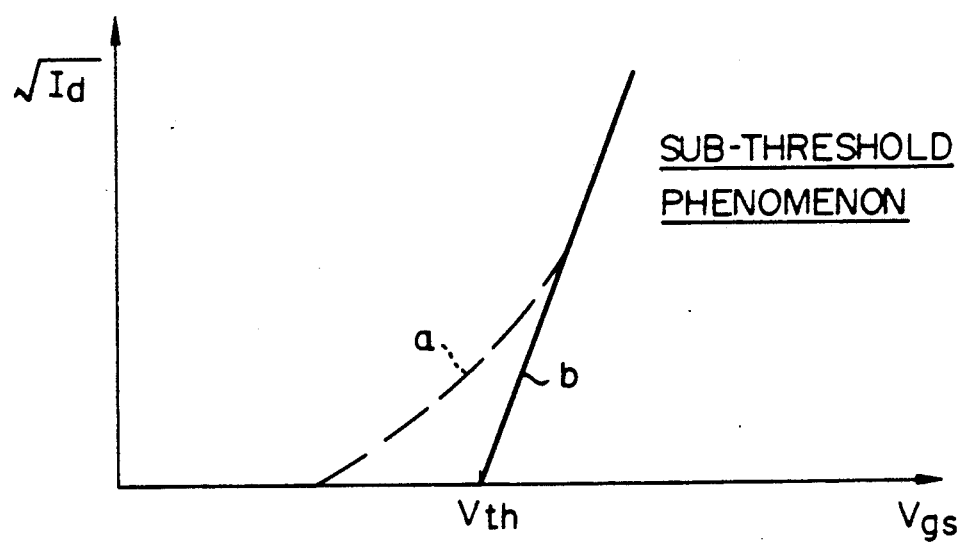
FIG. 6 is a characteristic diagram explaining a subthreshold.

FIG. 5A is an energy band diagram in which the quantum well QW is formed between the i-AlGaAs layers 41 and 12. FIG. 5B shows the distribution of electrons (e) in the quantum well QW. The planar doping or high doping layer is formed in the quantum well QW. The electrons supplied from the layer are confined by heterojunctions to maintain the two-dimensionality. The thickness of the quantum well QW is virtually about 100 angstroms, to provide the two-dimensionality.

The device shown in FIG. 4 has the following characteristics:

(i) The number of carriers in this device can be increased with increasing sheet doping density, while carrier density in a HEMT or a MODFET is limited by Fermi-level crossing the bottom of conduction-band in n-AlGaAs layer.

Also, excess carriers can be generated in the channel under the forward gate bias condition due to MIS operation of this device.

(ii) The doping concentration in the channel is high, and electrons are confined by the heterojunctions of the quantum well QW so that a narrow channel is formed to further reduce the short channel effect in comparison with the prior art MESFET.

(iii) Since the electrons are confined by a relatively high barrier of a lower heterojunction (the right heterojunction in FIG. 2), a current cutoff characteristic, the so-called sub-threshold characteristic, is excellent in the vicinity of a current zero line (in the vicinity of a pinchoff).

(iv) Since a gate capacitance is constant due to MIS type structure, the linearity of a device characteristic (a constant gm) will be satisfactorily realized.

(v) The doping is done for the GaAs layer (no ΔX-centre) so that the threshold is less affected by temperature.

(vi) Since the channel is two-dimensional, the impurity doping is limited to a part in the quantum well (especially, doped close to heterojunctions) the carrier mobility can be maintained and improved.

(vii) Since the gate electrode can be formed on a high resistance layer such as the i-GaAs layer and i-AlGaAs layer, the gate withstand voltage will be improved.

Figure 7:
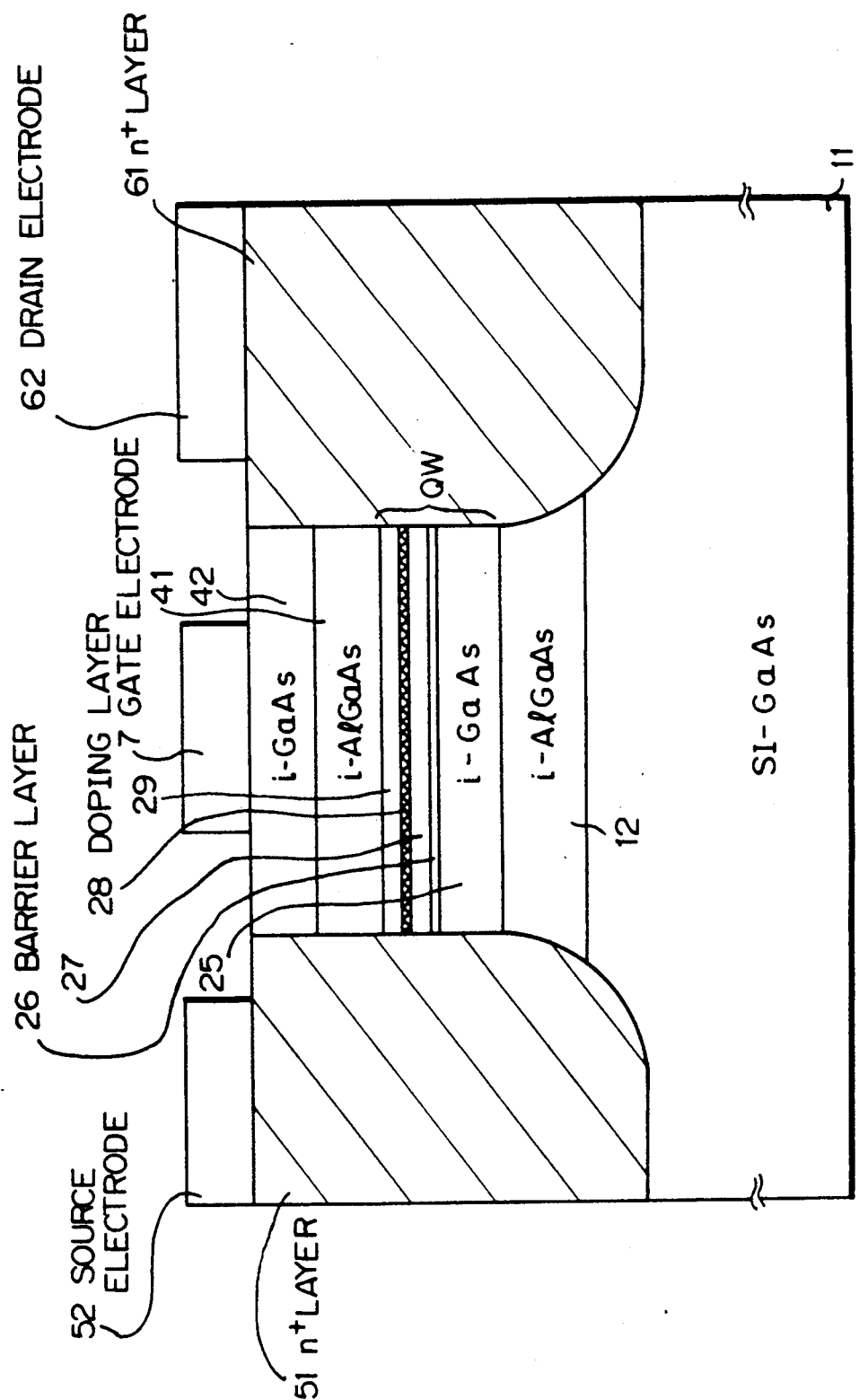
FIG. 7 is a view showing the constitution of a field effect transistor according to another embodiment of the present invention.

FIG. 7 shows a field effect transistor according to another embodiment of the present invention. In FIG. 7, on a semi-insulating GaAs substrate 11, a non-doped i-AlGaAs layer 12, a quantum well layer (QW) 2, an i-AlGaAs layer 41, and an i-GaAs layer 42 are formed and a lot of electrons, especially excess electrons screen the ionized impurity. A mole fraction x of the AlAs in the i-AlGaAs layers 12 and 41 is generally 0.2 to 1.0, and 0.2 to 0.3 in this embodiment.

The quantum well layer QW 2 comprises an i-GaAs layer 25, an i-AlGaAs barrier layer 26, i-GaAs layers 27 and 29, and a doping layer 28. The doping layer 28 is a planar doping or high doping layer.

The above layers may be embodied as follows:

Layers 12 and 41: These are i-AlGaAs non-doping layers each having a layer thickness of several hundred angstroms so that carriers cannot tunnel therethrough.

Layer 25: This is an i-GaAs non-doping layer having a layer thickness of 100 angstroms.

Layer 26: This is an i-AlGaAs non-doping layer having a layer thickness of 10 angstroms (=$l_1$) so that carriers can tunnel.

Layers 27, 28, and 29: These are GaAs layers having a total layer thickness of 20 angstroms (=$l_1$). The layers 27 and 29 are non-doping layers. If the layer 28 is a planar doping layer (an atomic planar doping layer where a single atomic layer or plural atomic layers of Si or Se are interposed between i-GaAs layers), the doping concentration by impurities of Si or Se will exceed $10^{20}$ cm$^{-3}$, and if the layer 28 is a high doping layer, the doping concentration will be about $10^{18}$–$10^{19}$ cm$^{-3}$. The doping n-GaAs layer 28 is provided with the non-doping i-GaAs layers 27 and 29 on both sides thereof to prevent the dopants from diffusing toward the i-AlGaAs layers 26 and 41. The quantum well QW 2 comprising the layers 25, 26, 27, 28, and 29 is, for instance, 130 Å in thickness to ensure the two-dimensionality.

Layer 42: This is an i-GaAs non-doping layer having a layer thickness of several hundred angstroms.

In FIG. 7, the numerals 51 and 61 represent n$^+$ regions of $10^{17}$ to $10^{18}$ cm$^{-3}$ formed by an ion implantation with si$^+$ ions; 52 and 62 a source electrode and a drain electrode respectively (AuGe/Au); and 7 a gate electrode (Al).

Figure 8:
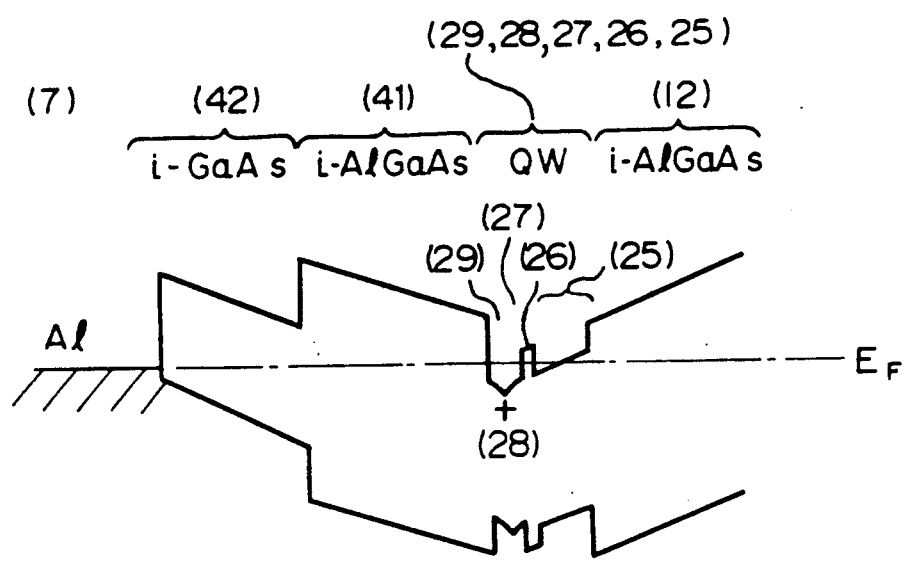
FIGS. 8A and 8B are characteristic diagrams explaining energy band and electron distribution in the device shown in FIG. 7.
Figure 8:

FIG. 7 shows an embodiment in which the quantum well is separated into narrow and wide width regions by the barrier. Another schematic diagram on the device shown in FIG. 7 will be described with reference to FIGS. 8A and 8B. FIG. 8A an energy band diagram showing the field effect transistor of the present invention. FIG. 8A shows a gate electrode 7 of Al, a cap layer 42 of i-GaAs layer, an i-AlGaAs layer 41, a quantum well QW, and an i-AlGaAs layer 12. The quantum well QW has a thin barrier 26 which is provided at an asymmetrical position such that electrons can tunnel therethrough. The quantum well QW region is separated by the barrier 26, and impurities are doped only for a narrow width region. The quantum well QW has a width of about 100 angstroms to provide the two-dimensionality. FIG. 8B shows electron distribution in the well.

As described above, the quantum well QW region has a thin AlGaAs barrier at the asymmetrical position thereof, so that electrons can tunnel through the barrier. As a result, the position probability density of electrons is small in the narrow width region of the quantum well, and large in the wide width region of the quantum well.

Namely, a quantum level energy En (by indefinite square well potential approximation) is proportional to an inverse of $\Delta x^2$ (the width $\Delta x$ of the quantum well) and sensitive to the width. Actually, if the quantum wells exist independently, the different energy levels are formed according to the wells.

Figure 9A:
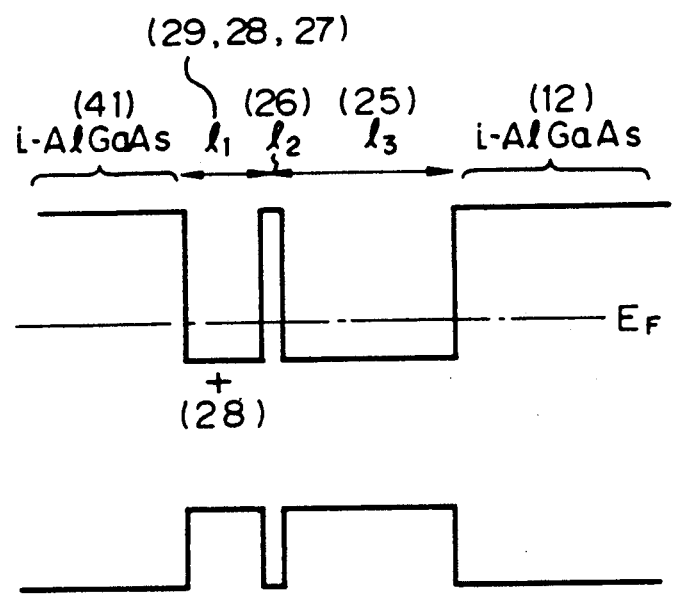
FIGS. 9A and 9B are enlarged illustrations of a portion of FIGS. 8A and 8B.
Figure 9B:
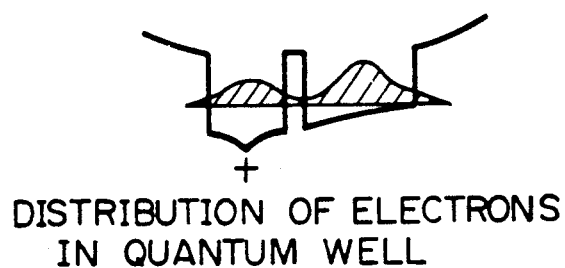

However, once the thin barrier through which electrons can tunnel is provided between quantum wells, only a single level is formed for the wells, but no separate levels are formed respectively for the narrow width region of layers 27, 28, and 29 and the wide width region 25. As a result, as shown in enlarged views of FIGS. 9A and 9B, electron distribution (hatched portion) in the narrow width region REGION-1 differs greatly from that in the wide width region REGION-2. It should be noted that, in FIG. 9A, band bending is not illustrated.

The present invention utilizes the above physical phenomenon to obtain an electron layer having a high average electron mobility through a method different from that of the prior art.

Namely, a high doping concentration n-layer 28 is employed in the narrow width region REGION-1 of the quantum well by a planar doping method, etc., to increase the position probability density of electrons in the wide width region REGION-2, which is the non-doping layer of the quantum well, so that a high mobility electron layer will be realized.

The electron layer formed is confined in the quantum well to achieve the two-dimensionality. For instance, $l_1 = 20$ angstroms, and $l_3 = 100$ angstroms.

The thickness and energy height of the thin barrier in the quantum well may be selected optionally, but shall be selected such that electrons can tunnel through the barrier.

The narrower the doping region of the quantum well, the larger the asymmetry between the narrow and the wide width regions, so that the whole electron mobility is improved.

The heterojunctions are formed using, for example, AlGaAs/GaAs/AlGaAs layers. The structure has an improved electron mobility compared to the MESFET and is expected to realize the same electron mobility as that of a conventional HEMT or MODFET structure. Since the GaAs material (no $\Delta X$-center) is doped, the threshold voltage is less affected by the variation of temperature and bias step.

Also, since the electrons are confined by the heterojunctions, the subthreshold characteristic is improved and the short channel effect is reduced. Moreover, the electron concentration in the channel can be increased with increasing doping density and thus a narrow channel can be realized. As a result, the short channel effect can be further prevented in comparison with the prior art MESFET, and thus greatly reduced.

For the similar reason, the linearity of the device characteristic is improved as well as employing a MIS structure of the present invention.

On the other hand, the prior art MESFET is a homojunction with a lower barrier, so that the characteristic curve of a gate voltage $V_{gs}$ and a drain current $I_d$ is far from linear, and the subthreshold characteristic is not satisfactory.

Figure 10A:
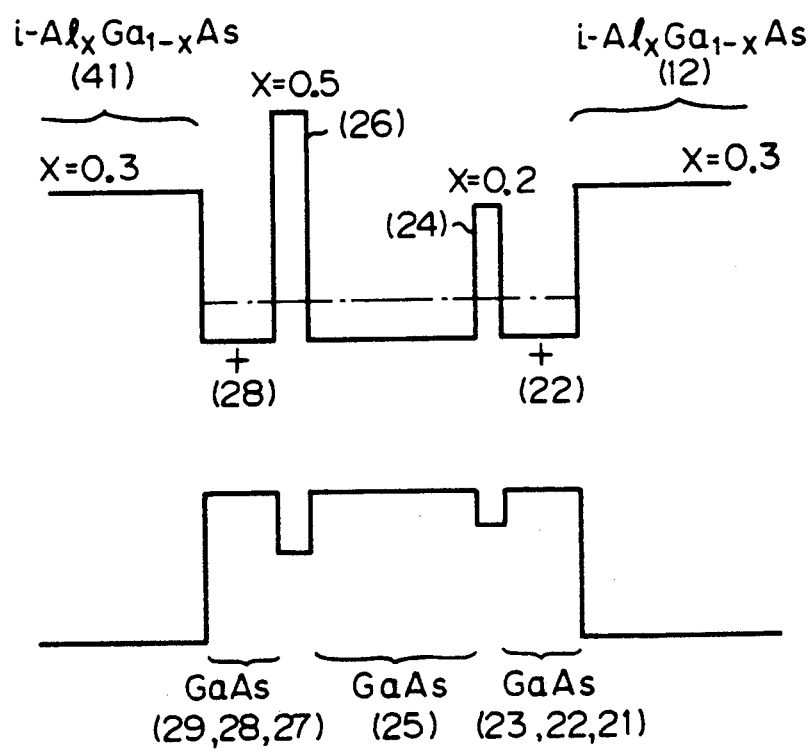
FIGS. 10A and 10B are characteristic diagrams showing energy band and electron distribution of the device according to still another embodiment of the present invention.
Figure 10B:
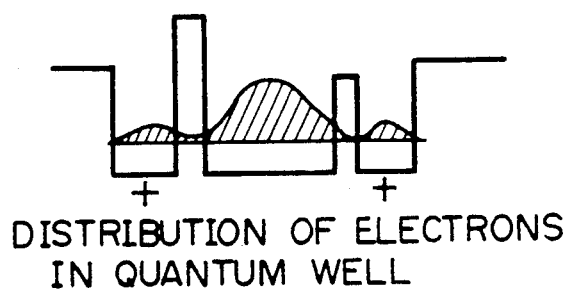

In addition to the above-described embodiments, many modifications can be made for the present invention. For example, a plurality of barriers through which electrons can tunnel and a square root of a drain current Id may be provided to dope impurities only for narrow width regions among regions partitioned by the plurality of barriers. The energy band for such a modified embodiment is shown in FIG. 10A. It should be noted that, in FIGS. 10A and 10B, band bending is not illustrated. Electron distribution is shown in FIG. 10B. In this embodiment, two barrier layers (i-AlGaAs) 22 and 24 through which electrons can tunnel are employed. A mole fraction x of the AlAs of the i-AlGaAs barrier layers 22 and 24 may be equal to each other or may be different from each other as shown in FIG. 10A. In this embodiment, x are 0.5 and 0.2. In FIG. 10A, narrow width regions REGION-1 and REGION-3 are formed on both sides of a quantum well and are provided with doping layers 28 and 22, respectively. The width of the center region REGION-2 is wider than those of both regions REGION-1 and REGION-3. The electrons will exist in the wider center region with a higher probability position density. Moreover, electrons are supplied from both of the narrow regions, so that a sheet carrier concentration Ns will be much higher than that of the embodiment shown in FIGS. 9A and 9B.

Figure 11A:
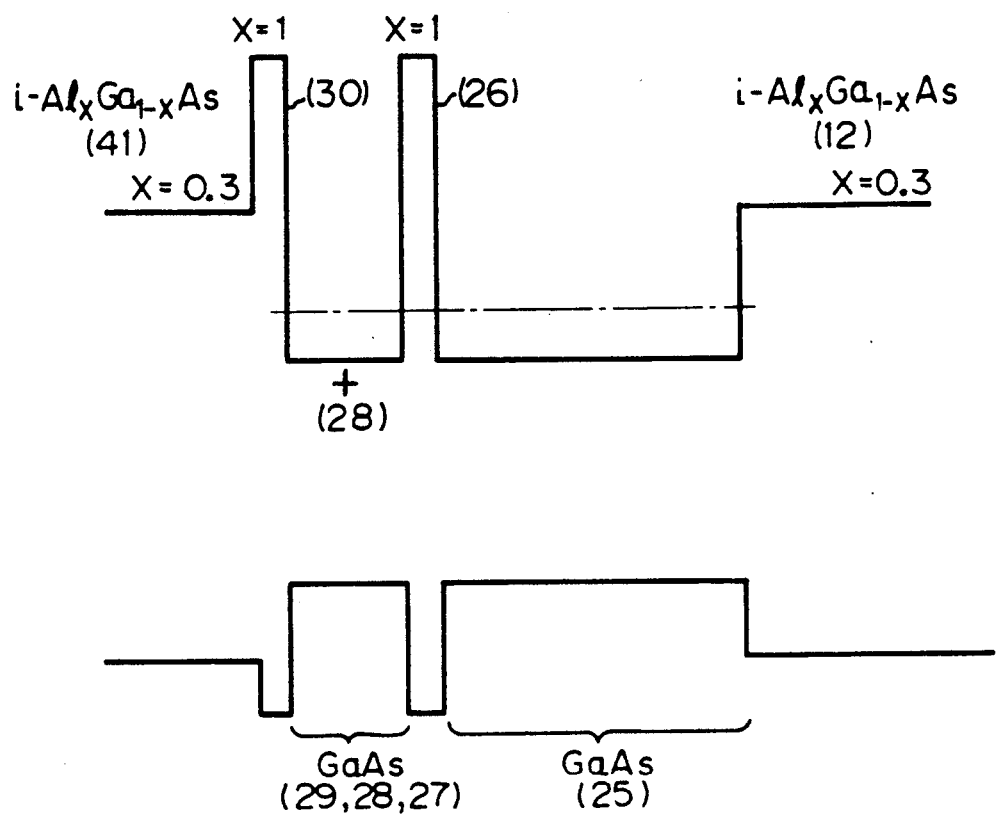
FIGS. 11A and 11B are characteristic diagrams showing energy band and electron distribution of the device according to still another embodiment of the present invention.
Figure 11B:
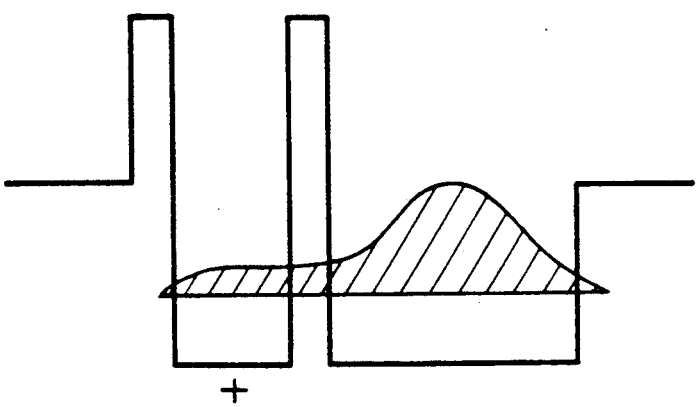

FIGS. 11A and 11B show still another embodiment of the present invention. It should be noted that, in FIGS. 11A and 11B, band bending is not illustrated. These show the energy band, and the electron distribution, respectively. In. FIG. 11A, AlAs barrier layers 26 and 30 are shown. Electrons provided from a narrow region tend to be more concentrated toward a wide region REGION-2 than in FIG. 9. This is because the higher barrier layer produces the larger number of carriers to be transferred into the wide region due to the larger difference in electron energy level. As a result, when the higher thin barriers (barriers with larger x) are provided on both sides of the doping layer 28 in the narrow width region, the number of carriers transferred at the non-doping wide region will increase and thus a much higher electron mobility will be realized.

The present invention allows a wide variety of materials for the construction of the device. Examples of pairs of materials having different electron affinity are InGaAs/InAlAs, Ga/GaAs, InP/InAlAs, GaAs/InGaP, GaSb/AlSb, and so on.

We claim:
1. A field effect transistor, comprising:
   a semiconductor substrate;
   a first semiconductor layer formed on said semiconductor substrate;
   a second semiconductor layer formed above said first semiconductor layer, said first and second semicon- ductor layers each having an electron affinity and each having an overall layer thickness such that carriers cannot tunnel therethrough;

a third semiconductor layer, formed between said first and second semiconductor layers and heterojunctions formed between said first and third semiconductor layers and said second and third semiconductor layers, said third semiconductor layer having an electron affinity larger than the electron affinity in the first and second semiconductor layers, forming a quantum well, and including a doped layer being planar doped or highly doped, electrons supplied from the doped layer being confined by said quantum well and forming a quasi-two-dimensional electron gas, and said third semiconductor layer having an entire layer thickness such that only one two-dimensional electron gas layer is formed as a channel layer;

a gate electrode, for controlling carriers in said third semiconductor layer, formed above said second semiconductor layer;

a source/drain region provided on two sides of said gate electrode and contacting said first, second and third semiconductor layers;

a source electrode and a drain electrode formed on said source/drain region; and a channel formed in said third semiconductor layer along said quantum well.

2. A field effect transistor according to claim 1, wherein said quantum well is provided as a single quantum well.

3. A field effect transistor according to claim 2, wherein said semiconductor substrate includes semi-insulator gallium-arsenide GaAs, said first and second semiconductor layers include aluminum-gallium-arsenide AlGaAs, said third semiconductor layer is made of gallium-arsenide GaAs, and a non-doped gallium-arsenide layer is located on both sides of said doped layer.

4. A field effect transistor according to claim 1, wherein said third semiconductor layer comprises:

a first layer including said doped layer, said first layer having a first thickness;

a second layer being substantially non-doped and having a second thickness greater than the first thickness; and a barrier layer, formed between said first and second layers, allowing a tunneling effect therethrough.

5. A field effect transistor comprising:

a semiconductor substrate formed of semi-insulating gallium-arsenide (GaAs);

a first semiconductor layer formed on said semiconductor substrate and formed of aluminum-gallium-arsenide (AlGaAs);

a second semiconductor layer formed above said first semiconductor layer and formed of AlGaAs, said first and second semiconductor layers each having an overall layer thickness such that carriers cannot tunnel therethrough;

a third semiconductor layer formed between said first and second semiconductor layers and formed of gallium-arsenide (GaAs), having a forbidden bandwidth narrower than a forbidden bandwidth of said first and second semiconductor layers and forming a quantum well, said third semiconductor layer including a doping layer being planar doped or highly doped, electrons supplied from said doping layer being confined by said quantum well and forming a quasi-two-dimensional electron gas, and having an entire layer thickness such that only one two-dimensional electron gas layer is formed as a channel layer;

a gate electrode for controlling carriers in said third semiconductor layer formed above said second semiconductor layer;

a source/drain region, provided on two sides of said gate electrode and contacting said first, second and third semiconductor layers;

a source electrode and a drain electrode formed on said source/drain region; and a channel formed in said third semiconductor layer along said quantum well.

* * * * *

UNITED STATES PATENT AND TRADEMARK OFFICE
CERTIFICATE OF CORRECTION

PATENT NO. : 5,023,674
DATED : JUNE 11, 1991
INVENTOR(S) : KOHKI HIKOSAKA ET AL.

It is certified that error appears in the above-identified patent and that said Letters Patent is hereby corrected as shown below:

Title Page: [63] line 1, "Jul. 14, 1988," should be --Jul. 15, 1988,--.

Col. 3, line 39, "$10^{17}$ to $cm^{-3}$" should be --$10^{17}$ to $10^{18} cm^{-3}$--.

Col. 4, line 62, "si$^+$" should be --Si$^+$--.

Col. 5, line 1, "8A an" should be --8A is an--.

Signed and Sealed this

Twenty-seventh Day of October, 1992

Attest:

DOUGLAS B. COMER

*Attesting Officer*    *Acting Commissioner of Patents and Trademarks*